United States Patent [19]

Eriksson et al.

[11] 4,370,671

[45] Jan. 25, 1983

[54] SEMICONDUCTOR DEVICE

[75] Inventors: Gunno Eriksson, Hallstahammar; Anders Nilarp, Vasteras, both of Sweden

[73] Assignee: Asea Aktiebolag, Vasteras, Sweden

[21] Appl. No.: 121,155

[22] Filed: Feb. 13, 1980

[30] Foreign Application Priority Data

Feb. 21, 1979 [SE] Sweden .................................. 7901535

[51] Int. Cl.³ .............................................. H01L 23/42
[52] U.S. Cl. .......................................... 357/79; 357/72; 357/38; 528/391
[58] Field of Search ............................. 357/79, 72, 38

[56] References Cited

U.S. PATENT DOCUMENTS

| | | | |
|---|---|---|---|
| 3,518,507 | 6/1970 | Bezouska et al. ........................ | 357/79 |
| 3,772,248 | 11/1973 | Brown et al. ............................ | 260/49 |
| 4,093,958 | 6/1978 | Riccio ................................... | 357/79 X |
| 4,188,637 | 2/1980 | Gerstenköper .......................... | 357/79 |
| 4,278,784 | 7/1981 | Wong .................................... | 357/72 X |

*Primary Examiner*—Martin H. Edlow
*Attorney, Agent, or Firm*—Watson, Cole, Grindle & Watson

[57] ABSTRACT

A semiconductor device comprises a semiconductor wafer arranged between metallic connecting members for supplying electric current to, and leading it from, the wafer, each connecting member having a substantially cylindrical external part. A ring of a sulphone polymer or of polyphenylene sulphide, which may be reinforced with glass fibre material, has portions of its internal peripheral surface surrounding and firmly engaged with the cylindrical parts of the connecting members, the ring and the connecting members forming a protective casing around the semiconductor wafer.

6 Claims, 2 Drawing Figures

SEMICONDUCTOR DEVICE

TECHNICAL FIELD

This invention relates to a semiconductor device which in particular, but not exclusively, is intended for large currents, for example current of 50 amperes and more.

Semiconductor devices for large currents usually comprise a semiconductor system having a semiconductor wafer, often of silicon, which is supported on one side, or each of its sides, with a supporting plate of a material having approximately the same coefficient of thermal expansion as the semiconducting material, for example molybdenum. The semiconductor devices are further provided with connecting members for supplying electric current to and leading it from the semiconductor wafer. The connecting members are often arranged in pressure contact with the semiconductor system. They are normally connected to cooling bodies, the semiconductor system thus being cooled from one direction or from both directions. The connecting members themselves may also be designed to serve as cooling bodies.

The semiconductor system with its semiconductor wafer is normally hermetically enclosed in a box to protect the semiconductor wafer from the harmful effect of the surrounding atmosphere. The bottom and lid of the box, which are of metallic material, are arranged along and in contact with the outwardly-facing surfaces of the semiconductor system and in contact with the connecting members. In addition to a bottom and a lid, the box comprises an intermediate member, between the bottom and the lid, in the form of one or more rings of ceramic material. The use of ceramic material for enclosing the semiconductor system involves time-wasting and costly work operations and above all a time-wasting soldering operation for joining the ceramic and metallic parts of the box. In spite of the fact that those skilled in the art are aware of these disadvantages, boxes of this construction are still used because of the reliable enclosure that is obtained. Protective casings comprising parts of plastics have not been used, although many embodiments of such protective casings have been proposed.

DISCUSSION OF THE PRIOR ART

According to one known proposal, the semiconductor system is mounted between two cylindrical connecting members, each making contact by an end surface with one side of the semiconductor system. A heat-shrinkable hose of polymeric material, in unshrunk state, is moved over the two cylindrical connecting members and is then heated to a temperature necessary for the hose to shrink and make contact with the connecting members, whereby an enclosure is formed around the semiconductor system. In practice, however, an enclosure formed in this way has been found to be totally unsatisfactory. Rubber sealing rings between metallic or ceramic parts have also been found to provide totally unsatisfactory results under operating conditions.

The present invention aims to provide a semiconductor device in which the semiconductor system is surrounded by a high-vacuum tight enclosure comprising parts of polymeric material, which remains reliable after a long period of operation under widely varying temperature conditions, for example temperatures ranging from −40° C. to 170° C.

DISCLOSURE OF THE INVENTION

According to the invention, a semiconductor device comprises a semiconductor wafer arranged between two metallic connecting members for supplying electric current to and leading it from said semiconductor wafer, each of said connecting members having a substantially cylindrical external part, and a ring, made from a sulphone polymer or polyphenylene sulphide, having peripheral portions of its internal surface surrounding and in engagement with respective ones of said substantially cylindrical parts, each of said peripheral portions, prior to engagement of the ring with said substantially cylindrical parts, having a diameter smaller than the diameter of the cylindrical part with which it is subsequently engaged, whereby said connecting members and said ring form a protective casing around the semiconductor wafer.

The internal peripheral portions of the ring preferably engage said substantially cylindrical parts with a surface pressure of at least 10 N/mm$^2$.

Engagement of the ring with said substantially cylindrical parts may be achieved by making use of the expansion of the ring upon heating and its contraction upon cooling. The ring is heated until it has a larger internal diameter than the diameter of the substantially cylindrical parts of the connecting members, it is then brought over these members and allowed or caused to cool. This results not only in the ring being stressed against the connecting members in the radial direction, but also in the connecting members being urged together in the axial direction of their substantially cylindrical parts. This latter feature is advantageous if the connecting members only make pressure contact with the semiconductor system, because this causes the semiconductor system to become fixed in position between the connecting members. The last-mentioned advantage is not obtained if the ring is pushed onto the connecting members in the axial direction of their cylindrical parts without being heated, but such a method of applying the ring may still be used since it provides a reliable enclosure.

The ensuring of the necessary engagement pressure between the ring and the connecting members to achieve tight joints may be facilitated if the ring is provided internally with ridges or with other protruding, coherent portions to bear against the substantially cylindrical parts of the connecting members. Alternatively, the substantially cylindrical parts may be provided with ridges or other protruding, coherent portions which bear against the ring. When using ridges or other protruding portions, it is assumed that a certain amount of plastic yielding of the material in the ring occurs as a consequence of the concentrated high surface pressure thus arising.

As mentioned above, the material of the ring is a sulphone polymer or polyphenylene sulphide. As examples of sulphone polymers may be mentioned polysulphone, polyether sulphone and polyphenylene sulphone. Especially preferred is polyether sulphone. The polymeric material in the ring may be reinforced with glass fibre material in an amount of up to 50 percent, preferably from 5 to 25 percent, of the total weight of the polymeric material and the glass fibre material. The glass fibres in the glass fibre material suitably have a length of from 0.2 to 2 mm. This addition of glass fibre material to the polymeric material increases the shape stability of the ring during long term operation.

The ring is preferably provided with ridges on its outer surface to increase the creep distance.

BRIEF DESCRIPTION OF THE DRAWING

The invention will now be described, by way of example, with reference to the accompanying drawing, in which.

DESCRIPTION OF PREFERRED EMBODIMENTS

Figure 1:
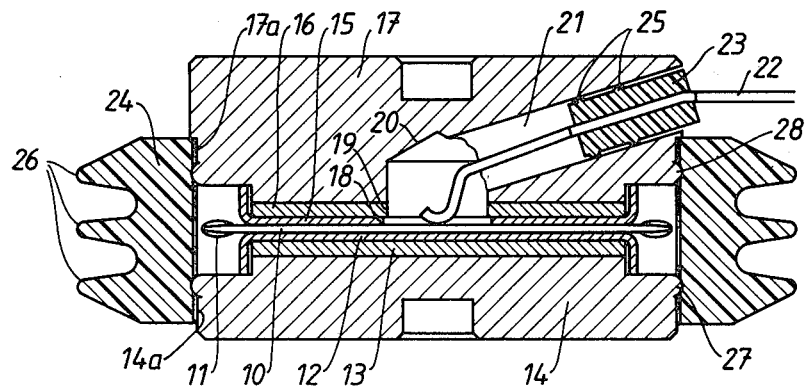
FIGS. 1 and 2 are sectional views of two different embodiments of a semiconductor device in accordance with the invention in the form of a thyristor, the section in each case being taken in the current direction of the semiconductor device.

The device according to FIG. 1 has a circular silicon wafer 10 of p-n-p-n type, which may be passivated, e.g. in a known way by treatment with a silane in gas phase. In its peripheral region the silicon wafer has a coating 11 of silicone rubber. A flat bowl 12 of silver bears against the lower side of the silicon wafer and a loose molybdenum plate 13 is placed in this bowl. A connecting member 14 of copper bears against the molybdenum plate 13. A flat bowl 15 of silver bears against the upper side of the silicon wafer 10 and a loose molybdenum plate 16 is placed in the bowl 15. A connecting member 17 of copper bears against the molybdenum plate 16. The silver bowl 15 and the molybdenum plate 16 are provided with holes 18 and 19, respectively, and the connecting member 17 is provided with a channel, formed by a radial hole 21 and a central recess 20, for the passage of a control electrode 22. The control electrode is hermetically sealed in a plug 23 cast from a polyether sulphone (for example "Victrex" (Trade Mark) 420 from Imperial Chemical Industries Limited, England) containing 20 percent by weight of glass fibre. On its peripheral surface, the plug 23 is provided with ridges 25 providing hermetic sealing against the wall of the hole 21 when the control electrode 22, embedded in the plug, is pressed into the hole 21 so that the peripheral surface of the plug is subjected to a pressure of at least 10 N/mm$^2$. The semiconductor system is hermetically enclosed between the connecting members 14 and 17 with a ring 24 made of the same material as the plug 23. The ring, which has a minimum radial thickness of 4 mm and an inner diameter of 24.6 mm in unstressed state at room temperature, is compression-moulded at a temperature of 350° C. and is provided with ridges 26 on its radially outer surface. The connecting members 14, 17 have cylindrical surfaces 14a and 17a, respectively, which are provided with ridges 27 and 28, respectively, the radially outermost parts of which have a diameter of 24.8 mm. When the ring 24 is applied on the cylindrical surfaces 14a, 17a of the connecting members it is heated to a temperature of about 125° C. The inner diameter of the ring, which prior to heating is about 1 percent smaller than the outer diameter of the ridges 27 and 28, respectively, then expands sufficiently for the ring to be positioned so that it surrounds the connecting members. When the ring cools, it shrinks and firmly engages the connecting members, with the result that the semiconductor system becomes hermetically enclosed.

Figure 2:
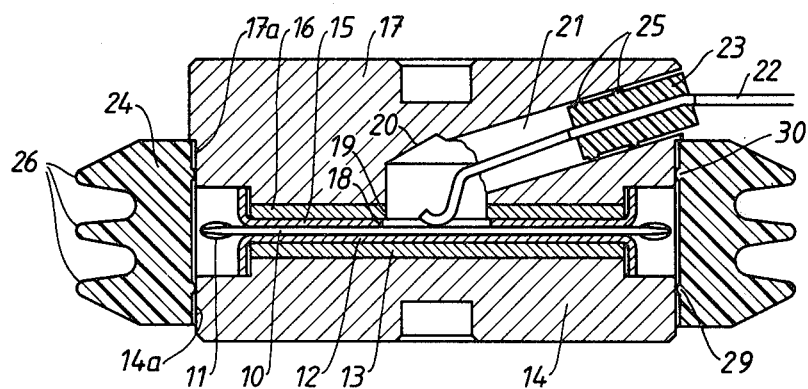

The device according to FIG. 2 differs from the device according to FIG. 1 only in that the ring 24 is provided with ridges 29 and 30 and in that the cylindrical surfaces 14a and 17a have no ridges.

Normally, cooling bodies are arranged on the connecting members 14, 17. These cooling bodies are of conventional kind and are not shown in the Figures. Because the cooling bodies are held pressed against each other, the connecting members are held pressed against the semiconductor system and provide the necessary contact between the parts of the semiconductor system and between the semiconductor system and the connecting members.

In the case where the semiconductor device consists of a diode, it has, of course, no control electrode. In that case there is no recess 20 and no hole 21 in the connecting member 17 and there are no holes 18 and 19 in the silver bowl 15 and the molybdenum plate 16, respectively.

What is claimed is:

1. A semiconductor device comprising a semiconductor wafer arranged between two metallic connecting members for supplying electric current to and leading it from said semiconductor wafer, each of said connecting members having a substantially cylindrical external part with at least one of the substantially cylindrical parts including an aperture, a control electrode extending through said aperture and contacting said semiconductor wafer, and a ring made from a material selected from the group consisting of a sulphone polymer and polyphenylene sulphide and having peripheral ridge portions on the internal surface thereof surrounding and in engagement with respective ones of said substantially cylindrical parts with a surface pressure of at least 10 N/mm$^2$, each of said peripheral portions, prior to engagement of the ring with said substantially cylindrical parts, having a diameter larger than the diameter of the cylindrical part with which it is substantially engaged, a plug of the same material as said ring and including ridges engaging the internal surface of said aperture with a pressure of at least 10 N/mm$^2$, whereby said connecting members and said ring form a protective casing around the semiconductor wafer.

2. A semiconductor device according to claim 1, in which said ring is made of polyether sulphone.

3. A semiconductor device according to claim 1, in which said ring is reinforced with glass fibre material.

4. A semiconductor device comprising a semiconductor wafer arranged between two metallic connecting members for supplying electric current to and leading it from said semiconductor wafer, each of said connecting members having a substantially cylindrical external part with at least one of the substantially cylindrical external parts including an aperture, a control electrode extending through said aperture and contacting said semiconductor wafer, and a ring, made from a material selected from the group consisting of a sulphone polymer and polyphenylene sulphide, said cylindrical external part having peripheral ridge portions on the external surface thereof and in engagement with the internal surface of said ring with a surface pressure of at least 10 N/mm$^2$, each of said peripheral portions, prior to engagement of the ring with said substantially cylindrical parts, having a diameter larger than the diameter of the cylindrical part with which it is subsequently engaged, a plug of the same material as said ring and including ridges engaging the internal surface of said aperture with a pressure of at least 10 N/mm$^2$, whereby said connecting members and said ring form a protective casing around the semiconductor wafer.

5. A semiconductor device according to claim 4, in which said ring is pushed onto said substantially cylindrical parts in the axial direction of the latter.

6. A semiconductor device according to claim 4, in which said ring is reinforced with glass fibre material.

* * * * *

UNITED STATES PATENT AND TRADEMARK OFFICE
CERTIFICATE OF CORRECTION

PATENT NO.   :   4,370,671
DATED        :   Jan. 25, 1983
INVENTOR(S)  :   Eriksson et al It is certified that error appears in the above-identified patent and that said Letters Patent is hereby corrected as shown below:

Claim 1:  Line 30, cancel "larger" and insert --smaller--.

Claim 4:  Lines 56 and 57, cancel "cylindrical part" and insert --ring--.

Signed and Sealed this

Eighteenth Day of December 1984

[SEAL]

Attest:

GERALD J. MOSSINGHOFF

*Attesting Officer*    *Commissioner of Patents and Trademarks*